(12) United States Patent
Mendoza

(10) Patent No.: US 6,321,917 B1
(45) Date of Patent: Nov. 27, 2001

(54) CABLE MANAGEMENT RACK FOR TELECOMMUNICATIONS EQUIPMENT

(75) Inventor: Jose-Filonel Tawag Mendoza, Brooklyn Center, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 09/712,803

(22) Filed: Nov. 14, 2000

(51) Int. Cl.⁷ ....................................................... A47F 7/00
(52) U.S. Cl. ............................................................... 211/26
(58) Field of Search .............................. 211/26, 189, 186; 361/727, 829, 826; 312/265.1

(56) References Cited

U.S. PATENT DOCUMENTS

| | | | |
|---|---|---|---|
| 4,715,502 | * | 12/1987 | Salmon ................................... 211/26 |
| 5,788,087 | * | 8/1998 | Orlando ................................... 211/26 |
| 5,867,372 | * | 2/1999 | Shie ..................................... 361/826 |
| 6,220,456 | * | 4/2001 | Jensen et al. ........................... 211/26 |

* cited by examiner

Primary Examiner—Alvin Chin-Shue
Assistant Examiner—Sarah Purol
(74) Attorney, Agent, or Firm—Merchant & Gould P.C.

(57) ABSTRACT

The present disclosure relates to a rack for mounting telecommunications equipment for receiving cross-connect modules and cables. The rack includes a frame defining a bay formed between two spaced-apart, vertical end walls. The bay is sized for receiving telecommunications equipment. The rack also includes cable management structure connected to the frame. The cable management structure includes first and second front vertical cable channels. Rear cable supports extend rearwardly from the rack. The vertical channels include two nested channels wherein the two vertical channels face each other. A top of the rack includes two nested channels. A base of the rack includes a first plate, and two transversely extending second plates, and a gusset between the transversely extending plates and the vertical channels.

11 Claims, 22 Drawing Sheets

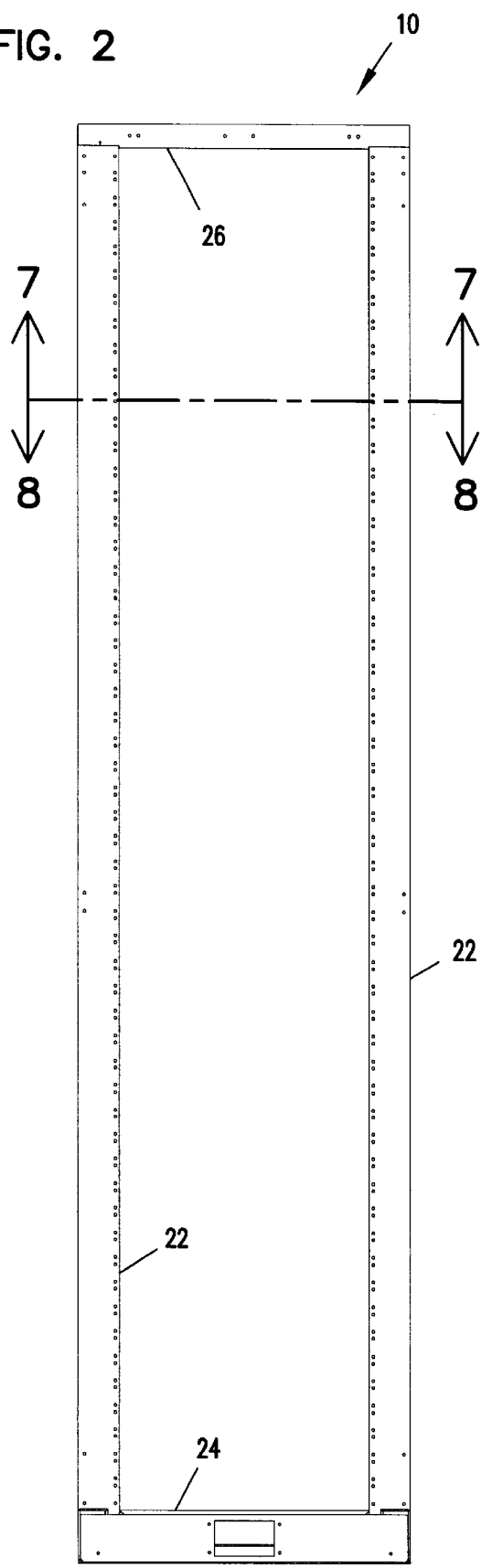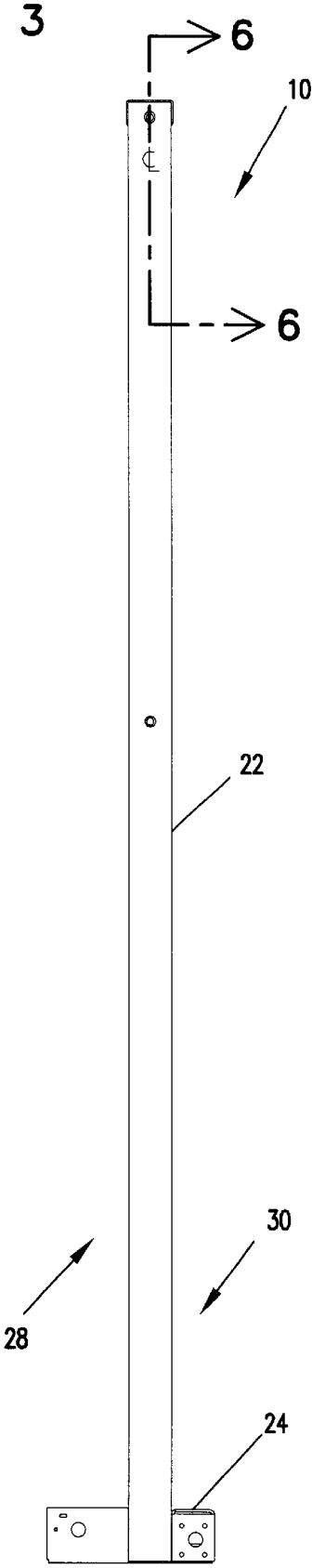

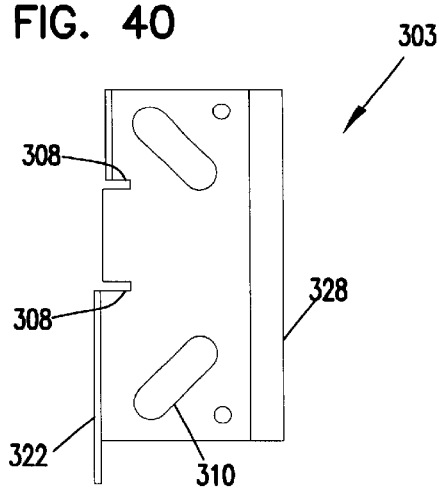
FIG. 40
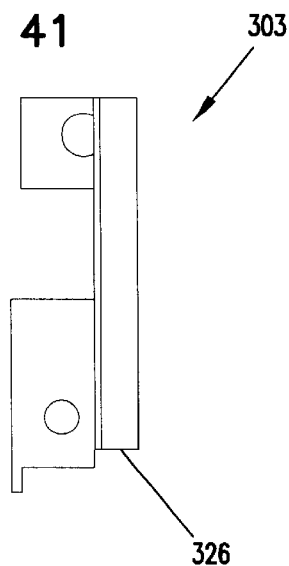
FIG. 41
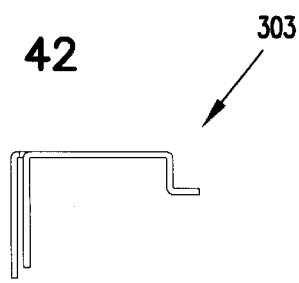
FIG. 42
FIG. 43
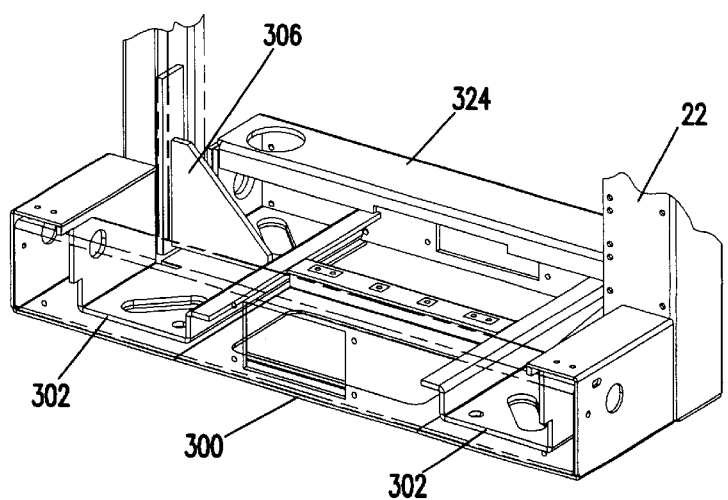

FIG. 62

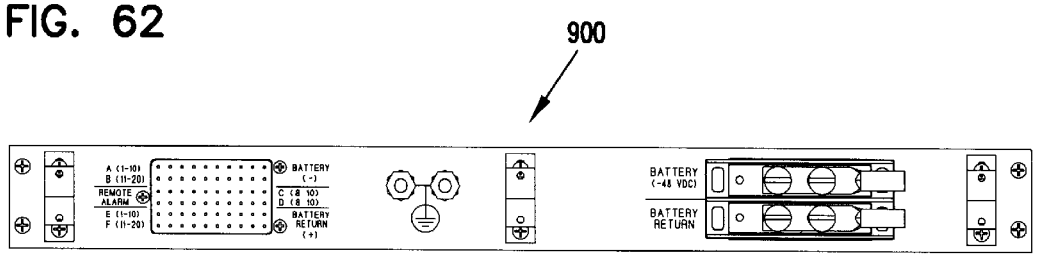

FIG. 63

| POWER WIRING TABLE |||| 
|---|---|---|---|
| DSX MODULE POSITION AND TERMINALS (-48V & GND) | -48VDC FUSE PANEL OUTPUT TERMINALS |||
| | REAR || FRONT |
| | ROW | POS | FUSE POSITION |
| DSX MODULE POSITION 1 | BATTERY | A-1 | POSITION 1 (1/2 AMP) |
| | RETURN | E-1 | |
| DSX MODULE POSITION 2 | BATTERY | A-2 | POSITION 2 (1/2 AMP) |
| | RETURN | E-2 | |
| REPEATED WIRING PATTERN ||||
| DSX MODULE POSITION 10 | BATTERY | A-10 | POSITION 10 (1/2 AMP) |
| | RETURN | E-10 | |
| DSX MODULE POSITION 11 | BATTERY | B-1 | POSITION 11 (1/2 AMP) |
| | RETURN | F-1 | |
| DSX MODULE POSITION 12 | BATTERY | B-2 | POSITION 12 (1/2 AMP) |
| | RETURN | F-2 | |
| REPEATED WIRING PATTERN ||||
| DSX MODULE POSITION 15 | BATTERY | B-5 | POSITION 15 (1/2 AMP) |
| | RETURN | F-5 | |
| DSX MODULE POSITION 16 | BATTERY | B-6 | POSITION 16 (1/2 AMP) |
| | RETURN | F-6 | |
| POSITION 17 THROUGH 20 ARE NOT IN USE ||||

CABLE MANAGEMENT RACK FOR TELECOMMUNICATIONS EQUIPMENT

FIELD OF THE INVENTION

The present invention relates generally to the field of telecommunications equipment. More particularly, the present invention relates to high density frames, bays or racks for providing cross-connections between telecommunication circuits.

BACKGROUND OF THE INVENTION

A digital cross connect system (DSX) provides a location for interconnecting two digital transmission paths. The apparatus for a DSX is located in one or more frames, racks or bays, usually in a telephone central office. The DSX apparatus also provides jack access to the transmission paths.

DSX jacks are well known and typically include a plurality of bores sized for receiving co-axial or tip-and-ring plugs. In the case of co-axial plugs, the bores are provided with center conductors and co-axial grounds. In the case of tip-and-ring plugs, a plurality of spring contacts are provided within the bores for contacting the tip-and-ring plugs. The jacks are typically electrically connected to digital transmission lines, and are also electrically connected to a plurality of wire termination members used to cross-connect the jacks. By inserting plugs within the bores of the jacks, signals transmitted through the jacks can be interrupted or monitored.

The number of jacks or cross-connect points that are located at a bay of a given size is referred to as the density of a bay. As the cross-connect density increases, the management of telecommunication wires in the bay becomes increasingly complex. For high density DSX bays, wire management is critical. U.S. Pat. No. 6,102,214, commonly owned by ADC Telecommunications, shows a cross-connect rack with cross-connect modules. The disclosure of U.S. Pat. No. 6,102,214 is hereby incorporated by reference.

Further developments are desired in the rack area. One area for improvement is strength and durability of the rack, such as during an earthquake. A further area of development is with respect to the size and cable management features which can fit above floor tiles constructed with a 600 millimeter by 600 millimeter perimeter.

SUMMARY OF THE INVENTION

A rack for mounting telecommunications equipment is provided for receiving cross-connection modules and cables. The rack includes a frame defining a bay formed between two spaced-apart, vertical end walls. Each end wall is preferably constructed as upright vertical channels with the flanges of the channels facing toward the flanges of an opposite channel. Each channel preferably includes first and second nested U-shaped channel supports. A top of the frame preferably includes first and second nested U-shaped channel members. A base of the frame defines first and second rear notches adjacent the floor, for passage of telecommunications cables vertically upward through the floor. The base preferably includes a first base plate extending between the upright channels, and two second base plates extending transversely, and a gusset between each of the second base plates and each upright channel on each side of the base.

The rack also preferably includes cable management structure connected to the frame including front cable guides defining vertical cable channels, horizontal cable trays, and back cable support brackets. Each back cable support bracket preferably includes an extension including a linear array of holes, a support tab extending transversely to the extension, a distal tab extending transversely to the extension at an opposite end of the extension from the support tab, and a power cord tab extending from the support tab in a direction toward the extension from an opposite side of the support tab from the extension.

A variety of advantages of the invention will be set forth in part in the description that follows, and in part will be apparent from the description, or may be learned by practicing the invention. It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of this specification, illustrate several aspects of the invention and together with the description, serve to explain the principles of the invention. A brief description of the drawings is as follows:

FIG. 2 is a front view of the rack of FIG. 1;

FIG. 3 is a side view of the rack of FIG. 1;

FIG. 40 is a top view of the left base support plate of FIG. 39;

FIG. 41 is an opposite side view of the left base support plate of FIG. 39;

FIG. 42 is an end view of the left base support plate of FIG. 39;

FIG. 43 is a front perspective view of the base without the front base cover or the front base support;

FIG. 62 is a front view of the fuse and power panel mounted in the bay of FIG. 56; and FIG. 63 is a wiring chart for the bay of FIG. 56.

DETAILED DESCRIPTION OF THE PREFERRED EMBODIMENTS

Reference will now be made in detail to exemplary aspects of the present invention that are illustrated in the accompanying drawings. Wherever possible, the same reference numbers will be used throughout the drawings to refer to the same or like parts.

Figure 1:
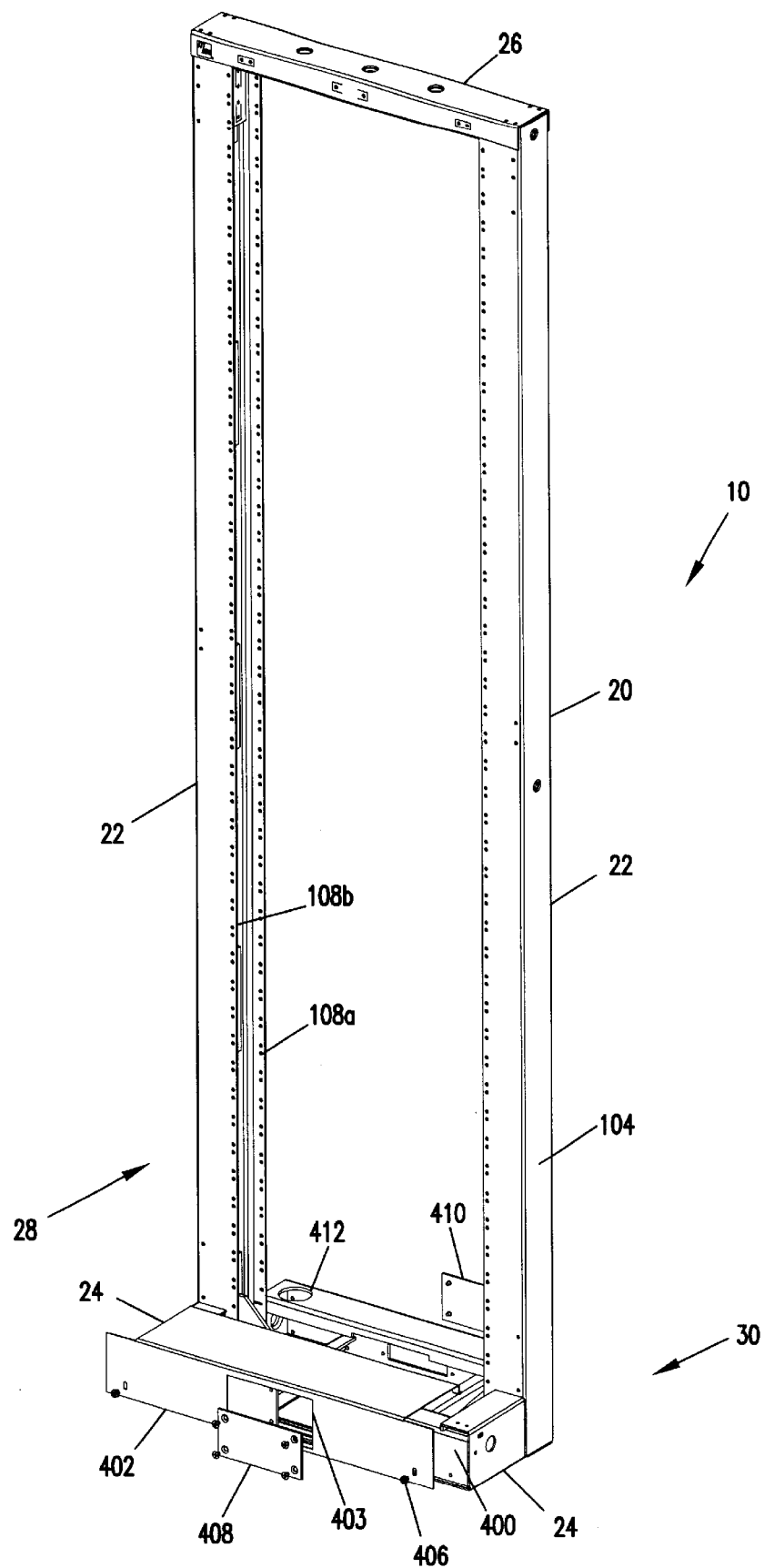
FIG. 1 is a front perspective view of a telecommunications rack constructed in accordance with the principals of the present invention.
Figure 4:
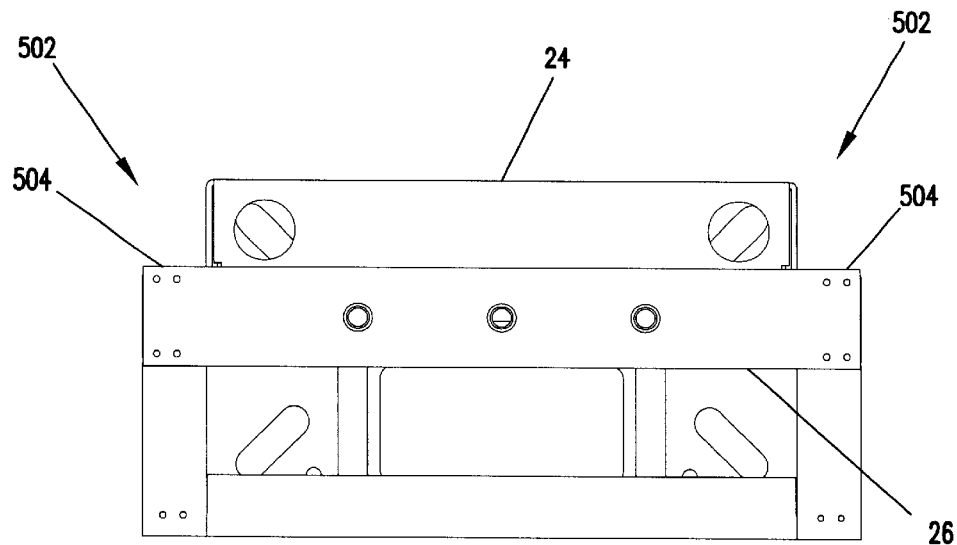
FIG. 4 is a top view of the rack of FIG. 1.
Figure 5:
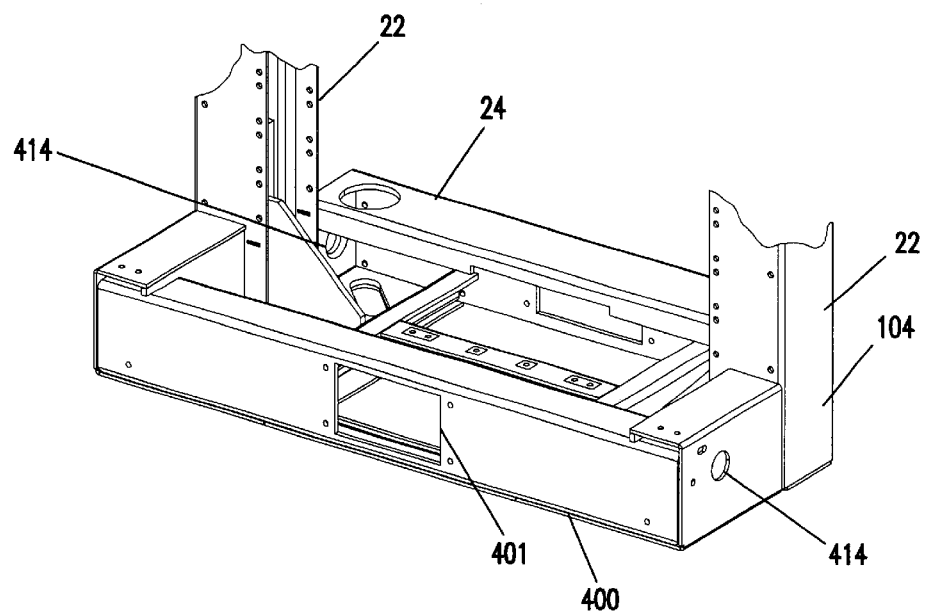
FIG. 5 is a perspective view of a lower portion of the rack of FIG. 1, with the front base cover removed, and the A/C outlet cover removed.
Figure 6:
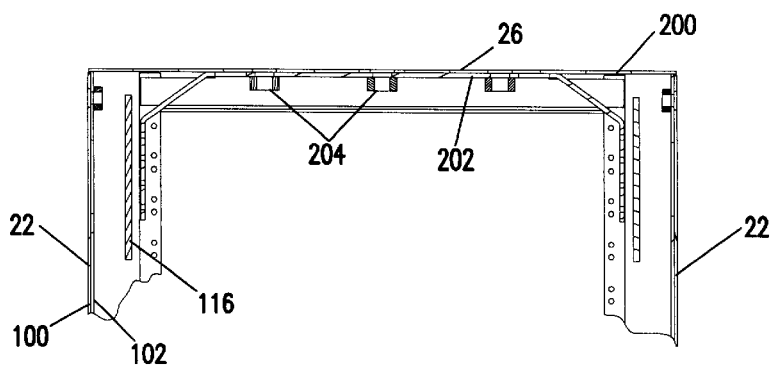
FIG. 6 is a partial cross-sectional front view of the rack of FIG. 1 along lines 6—6 of FIG. 3.
Figure 7:
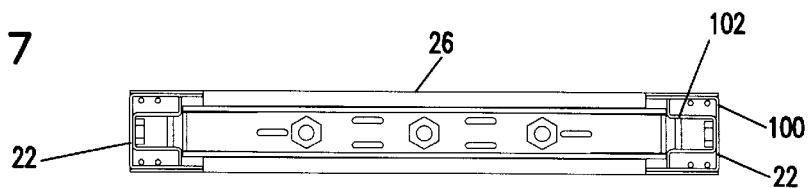
FIG. 7 is a view looking upwardly from a plane cut at lines 7—7 of FIG. 2.
Figure 8:
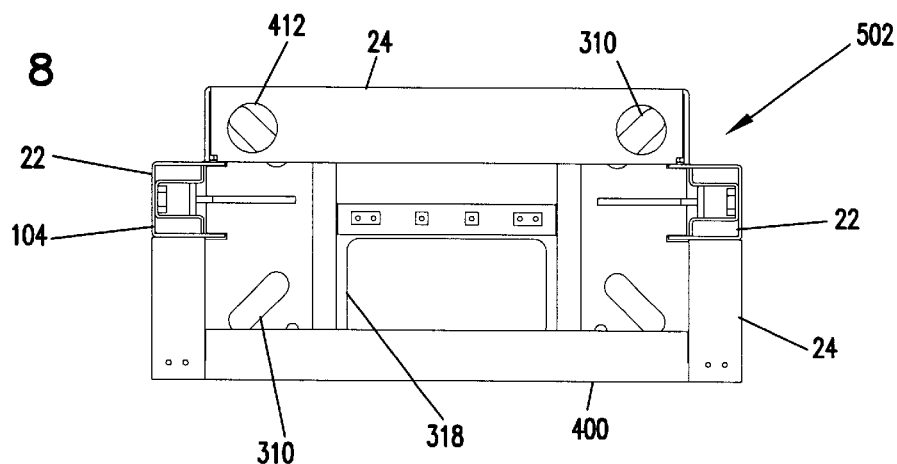
FIG. 8 is a view looking downwardly from a plane cut at lines 8—8 of FIG. 2.
Figure 9:
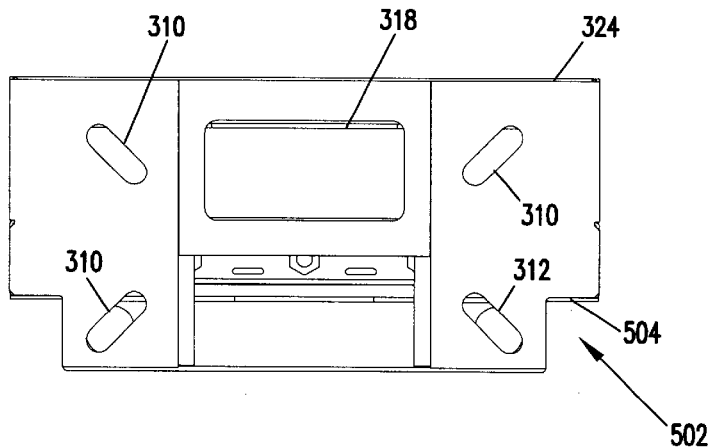
FIG. 9 is a bottom view of the rack of FIG. 1.
Figure 10:
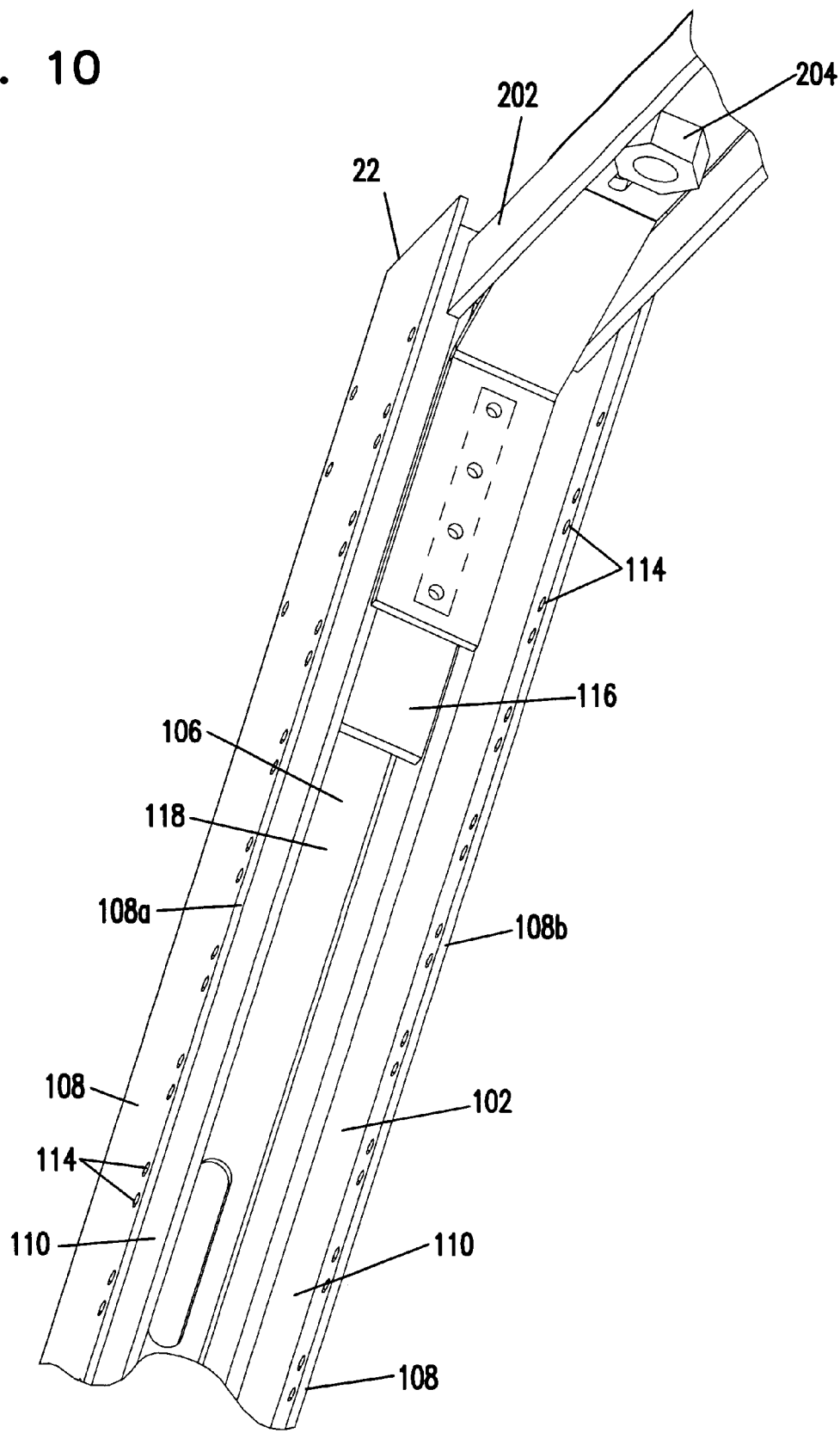
FIG. 10 is a partial perspective view showing internal features of an upper corner of the rack of FIG. 1.
Figure 11:
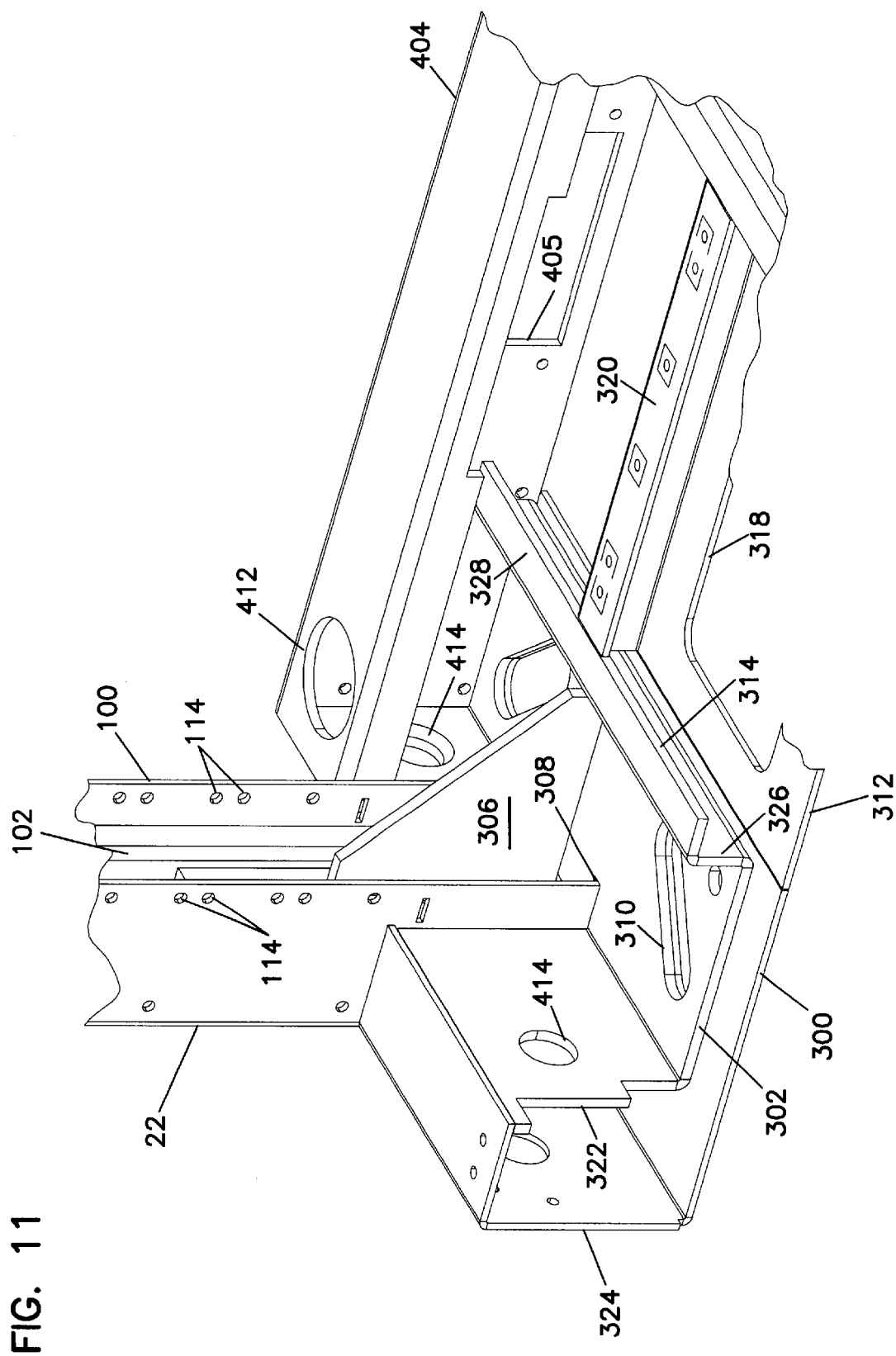
FIG. 11 is a partial perspective view of a bottom corner of the rack of FIG. 1 with portions removed.
Figure 12:
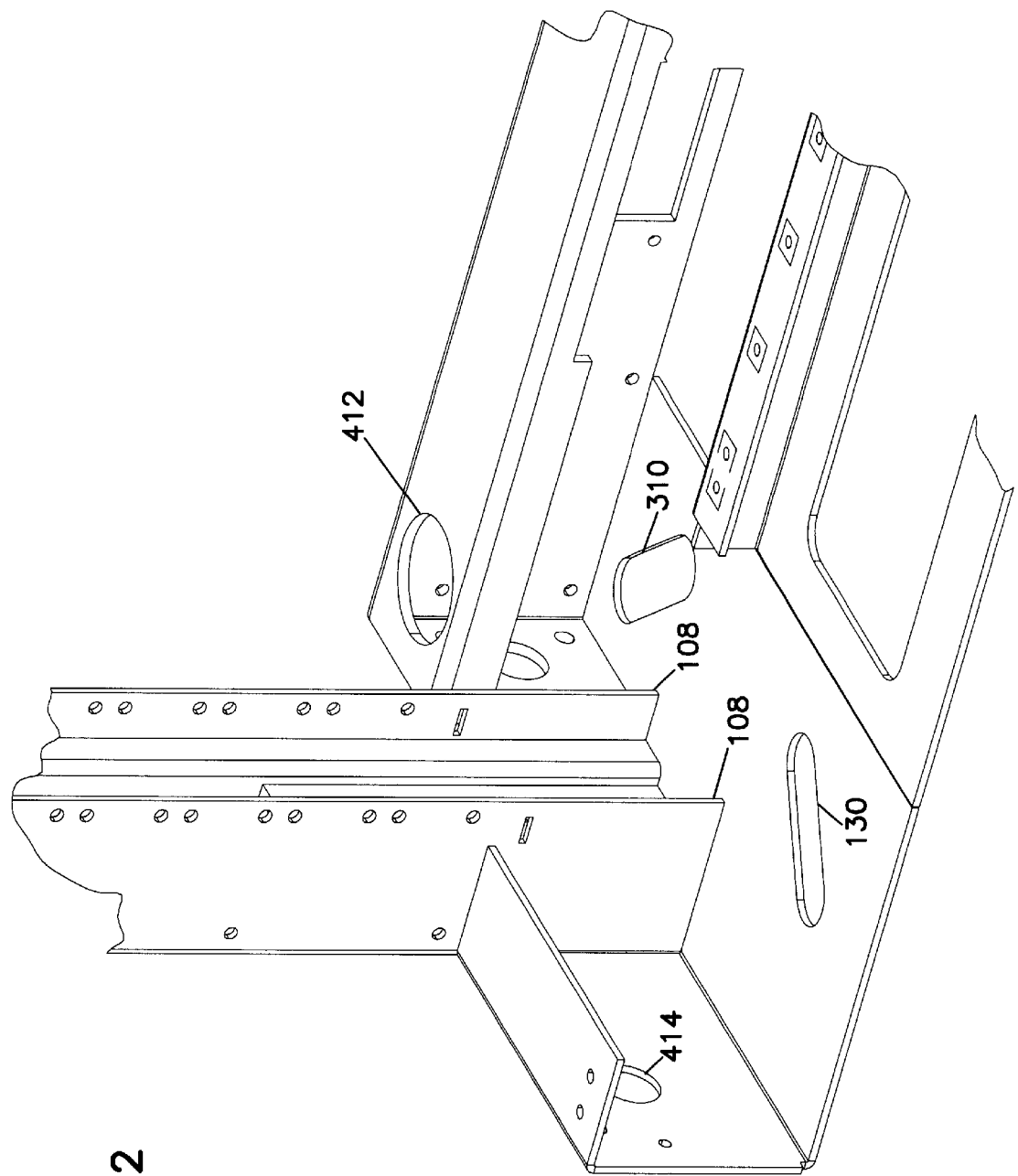
FIG. 12 is a further partial perspective view of the bottom corner shown in FIG. 11, with further portions removed.
Figure 13:
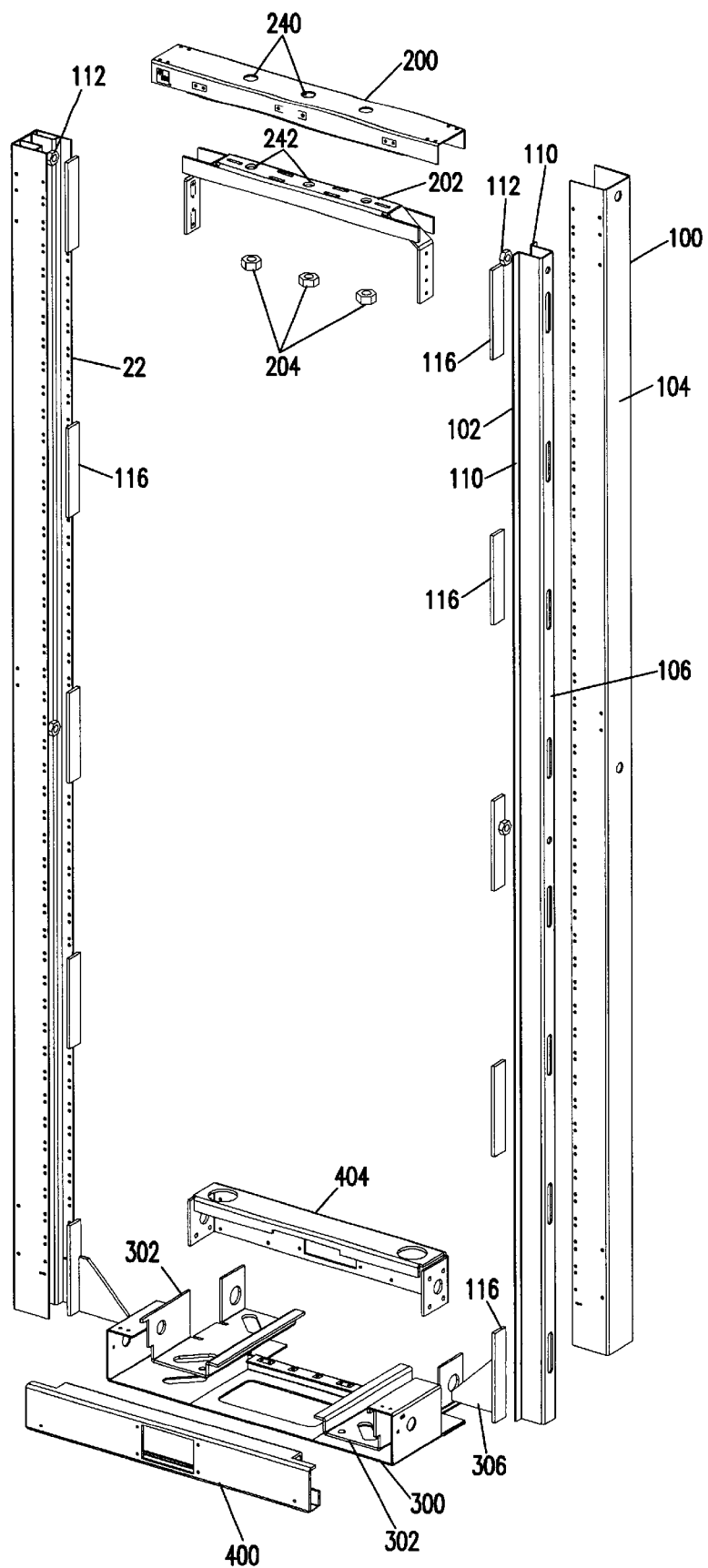
FIG. 13 is an exploded view of the rack of FIG. 1.
Figure 14:
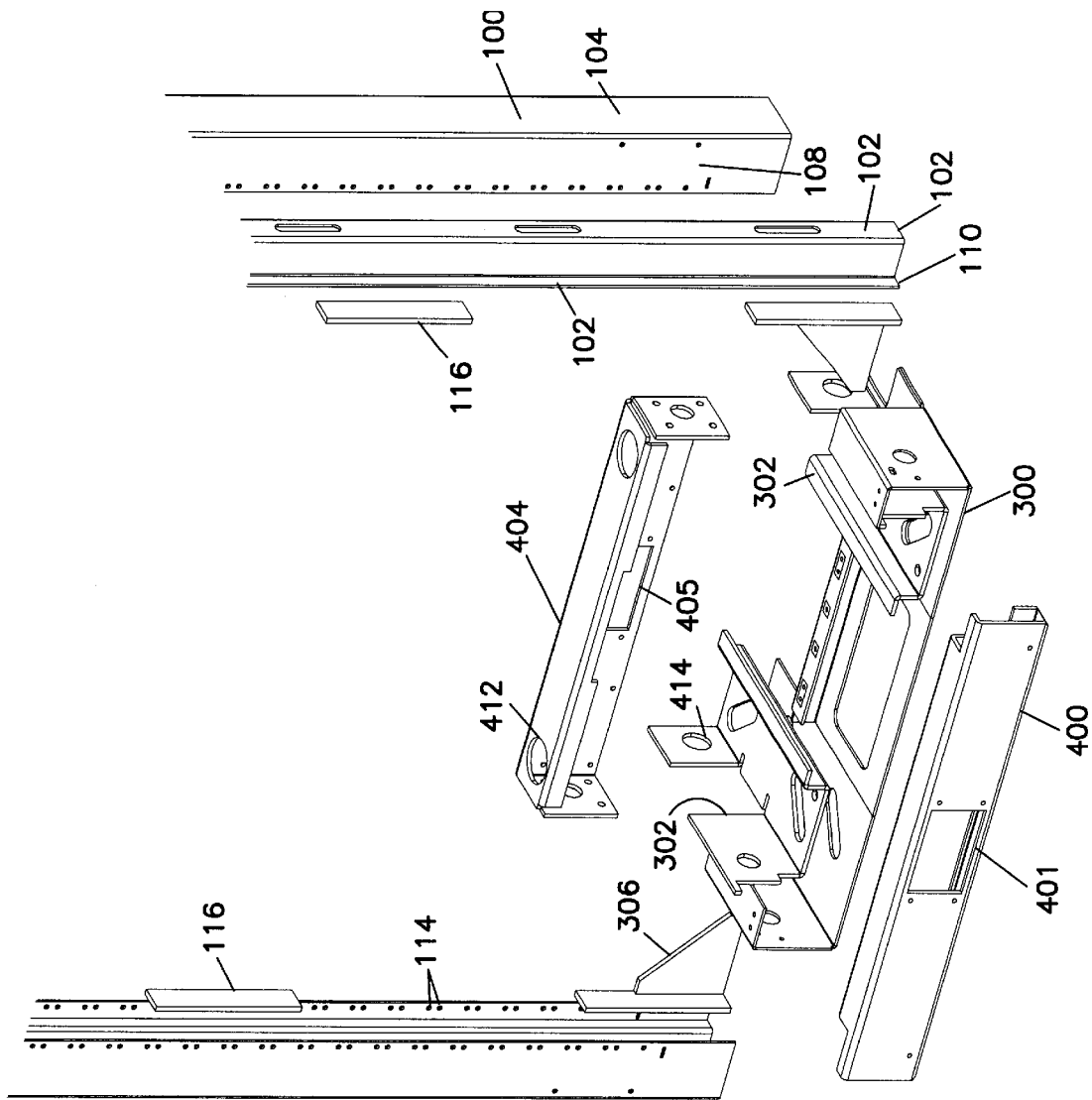
FIG. 14 is an enlarged view of a lower portion of the exploded view of FIG. 13.
Figure 15:
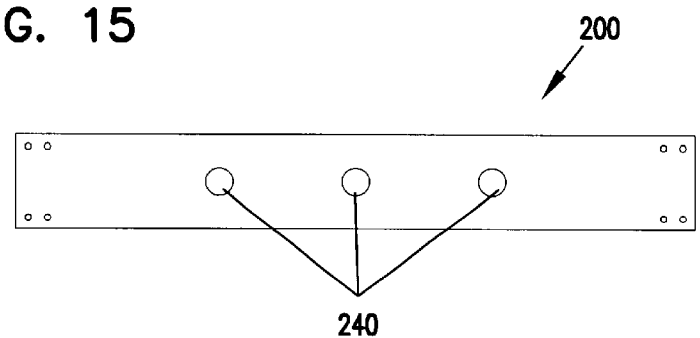
FIG. 15 is a top view of the outer top rail of the top member of the rack of FIG. 1.
Figure 17:
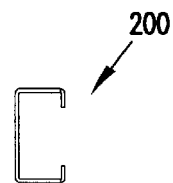
FIG. 17 is an end view of the outer top rail of FIG. 15.
Figure 16:
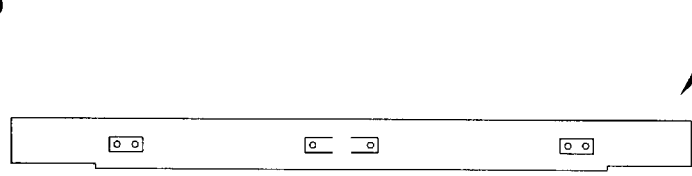
FIG. 16 is a front view of the outer top rail of FIG. 15.
Figure 18:
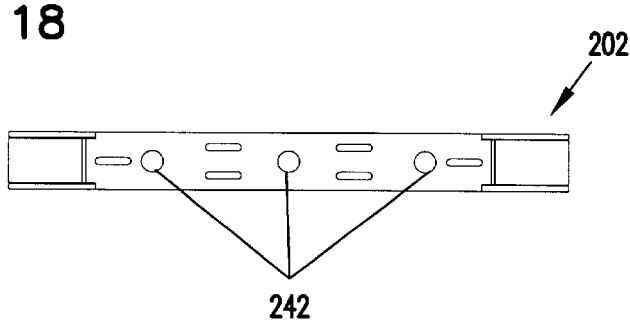
FIG. 18 is a top view of the inner top rail of the top member.
Figure 19:
FIG. 19 is a front view of the inner top rail of FIG. 18.
Figure 20:
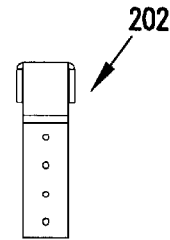
FIG. 20 is an end view of the inner top rail of FIG. 18.
Figure 21:
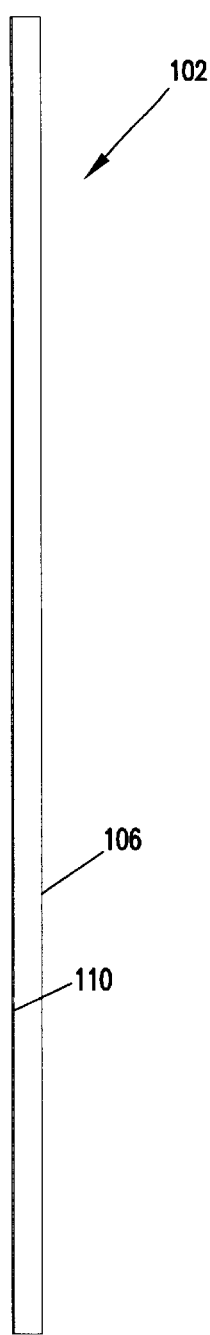
FIG. 21 is a front view of the inner vertical support of one of the upright channels of the rack of FIG. 1.
Figure 22:
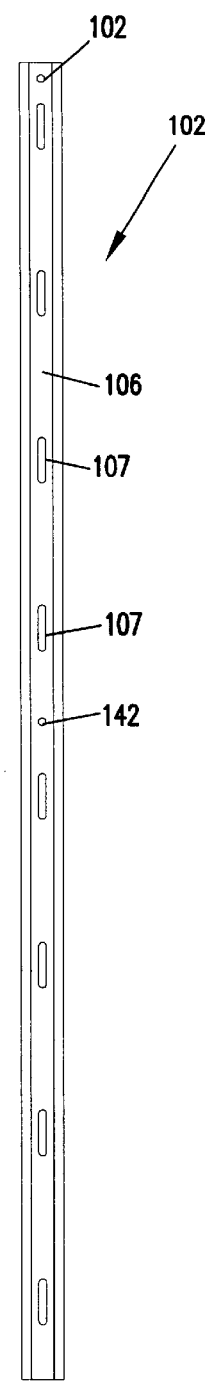
FIG. 22 is a side view of the inner vertical support of FIG. 21.
Figure 23:
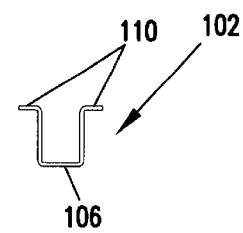
FIG. 23 is a top view of the inner vertical support of FIG. 21.
Figure 24:
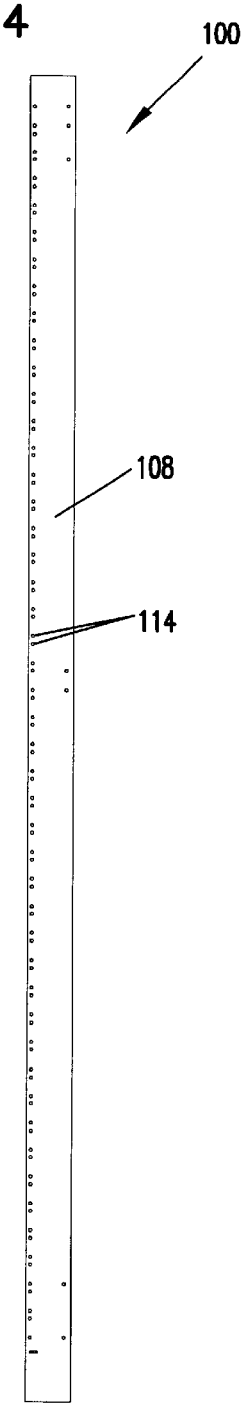
FIG. 24 is a front view of the outer vertical support of one of the upright channels of the rack of FIG. 1.
Figure 25:
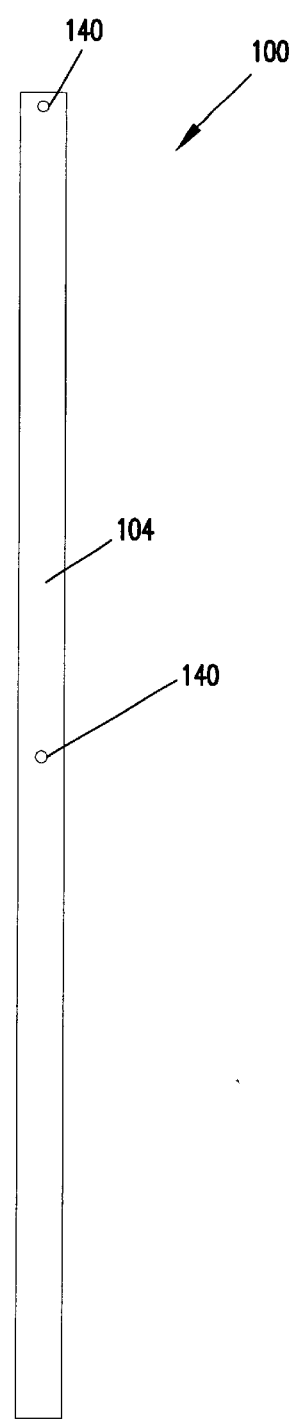
FIG. 25 is a side view of the outer vertical support of FIG. 24.
Figure 26:
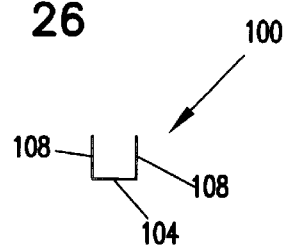
FIG. 26 is a top view of the outer vertical support of FIG. 24.
Figure 27:
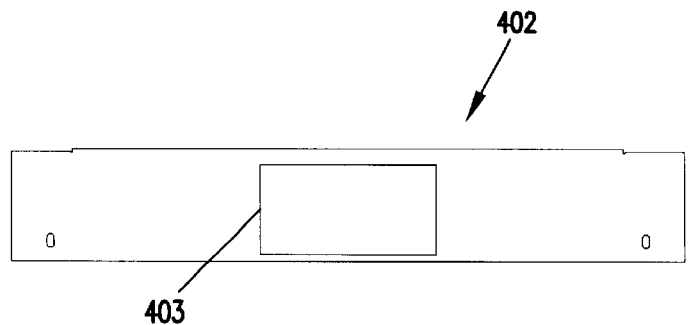
FIG. 27 is a front view of the front base cover.
Figure 28:
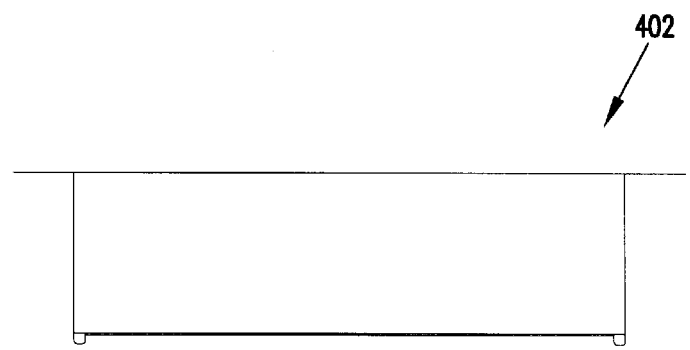
FIG. 28 is a bottom view of the front base cover of FIG. 27.
Figure 29:
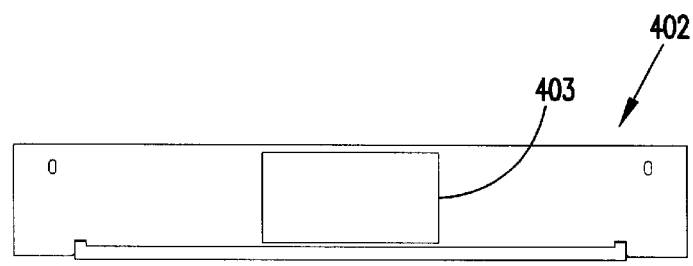
FIG. 29 is a back view of the front base cover of FIG. 27.
Figure 30:
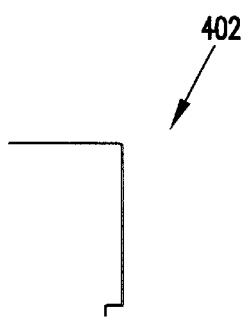
FIG. 30 is a side view of the front base cover of FIG. 27.
Figure 31:
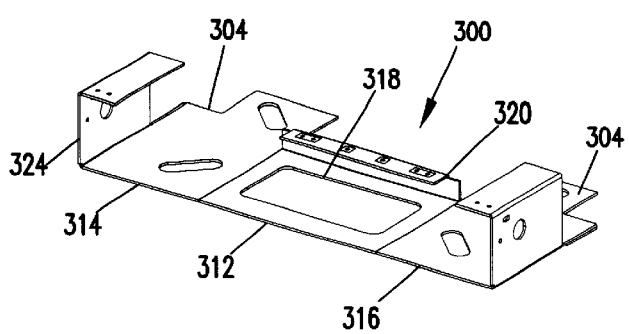
FIG. 31 is a perspective view of the base plate of the rack of FIG. 1.
Figure 32:
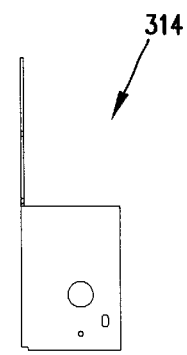
FIG. 32 is a side view of the left base bracket of the base plate of FIG. 31, the right base bracket constructed in a mirror image.
Figure 33:
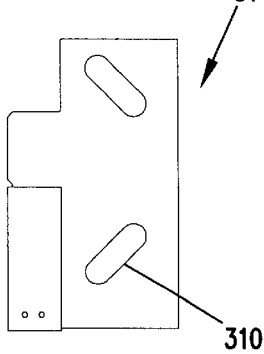
FIG. 33 is a top view of the left base bracket of FIG. 32.
Figure 34:
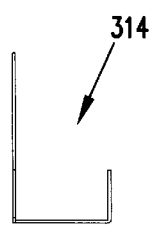
FIG. 34 is a front view of the left base bracket of FIG. 32.
Figure 35:
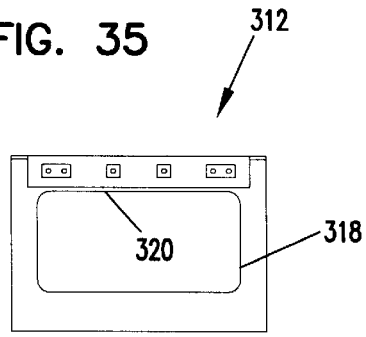
FIG. 35 is a top view of the middle base plate of the base plate of FIG. 31.
Figure 36:
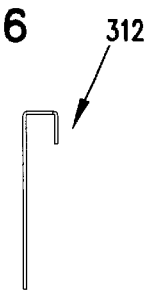
FIG. 36 is an end view of the middle base plate of FIG. 35.
Figure 37:
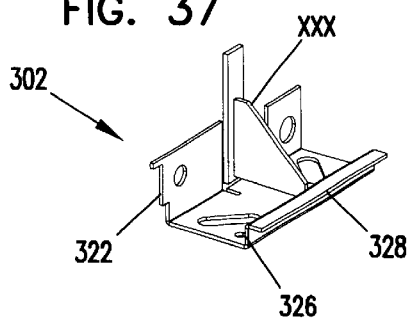
FIG. 37 is a perspective view of the left base support of the rack of FIG. 1.
Figure 38:
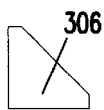
FIG. 38 is a front view of the gusset plate.
Figure 39:
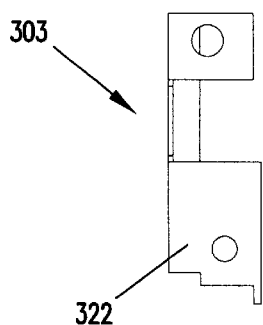
FIG. 39 is a side view of the left base support plate of FIG. 37, the right base support plate constructed in a mirror image.
Figure 44:
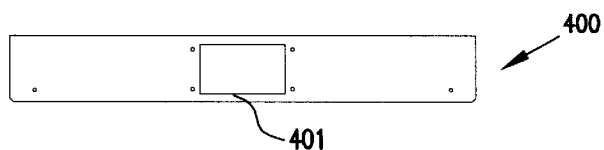
FIG. 44 is a bottom view of the front base support.
Figure 45:
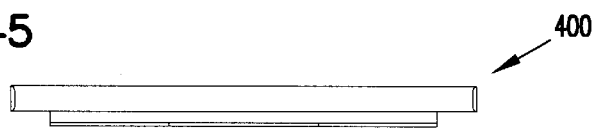
FIG. 45 is a top view of the front base support.
Figure 46:
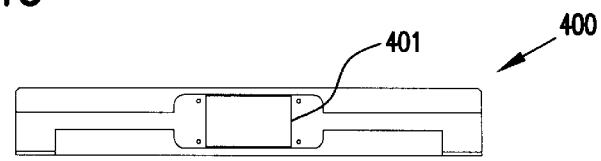
FIG. 46 is a back view of the front base support.
Figure 47:
FIG. 47 is a front view of the rear base support.
Figure 48:
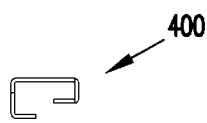
FIG. 48 is an end view of the front base support.
Figure 49:
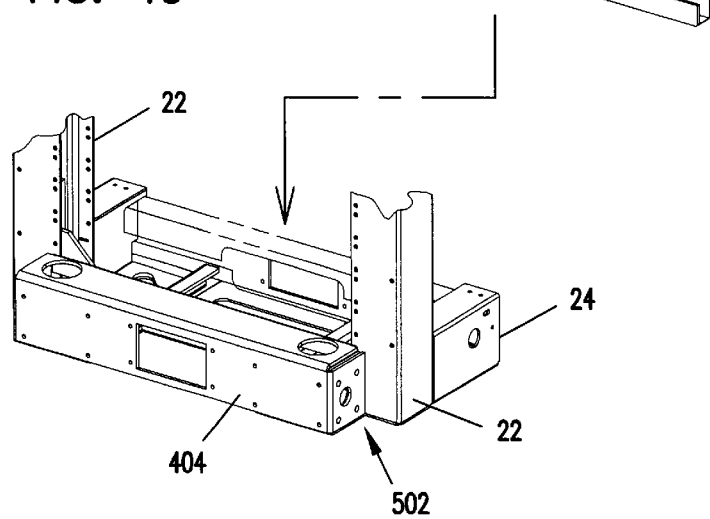
FIG. 49 is a back perspective view of the lower portion of the rack showing the front base support exploded from the remainder of the rack.
Figure 53:
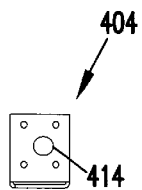
FIG. 53 is a first side view of the back base support.
Figure 50:
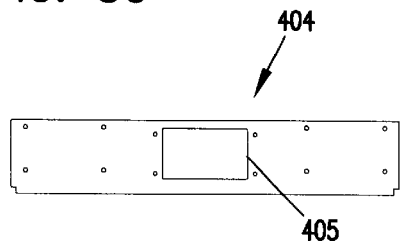
FIG. 50 is a front view of the back base support.
Figure 54:
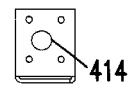
FIG. 54 is an opposite side view of the back base support.
Figure 51:
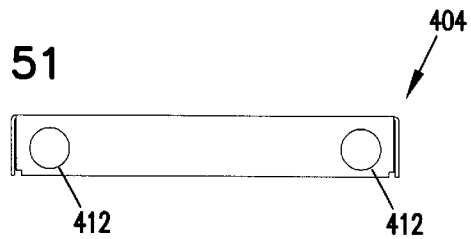
FIG. 51 is a top view of the back base support.
Figure 52:
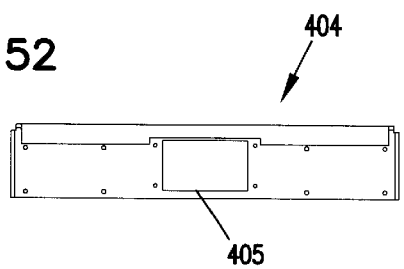
FIG. 52 is a back view of the back base support.
Figure 55:
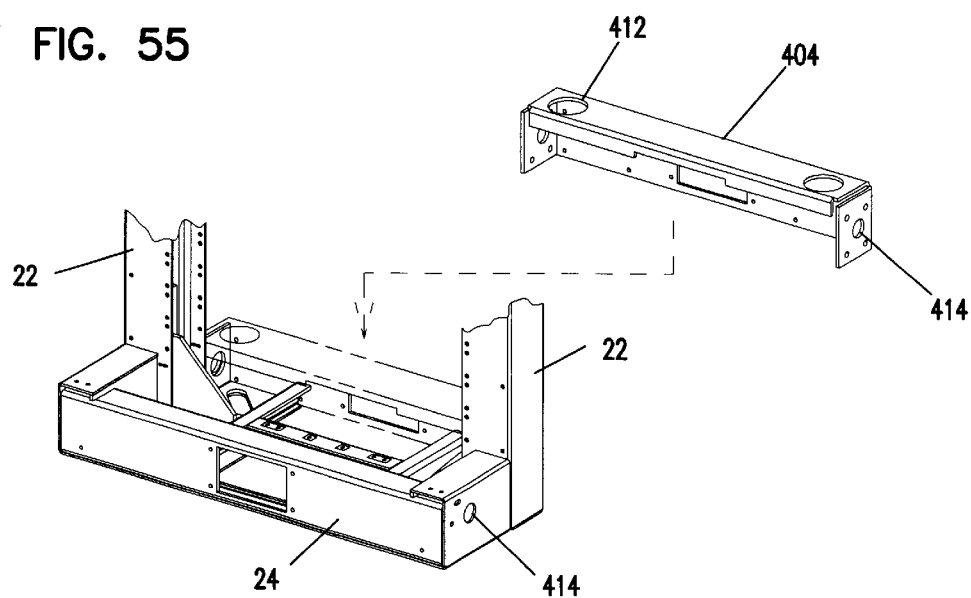
FIG. 55 is a front perspective view of the lower portion of the rack showing the back base support exploded from a remainder of the rack.
Figure 56:
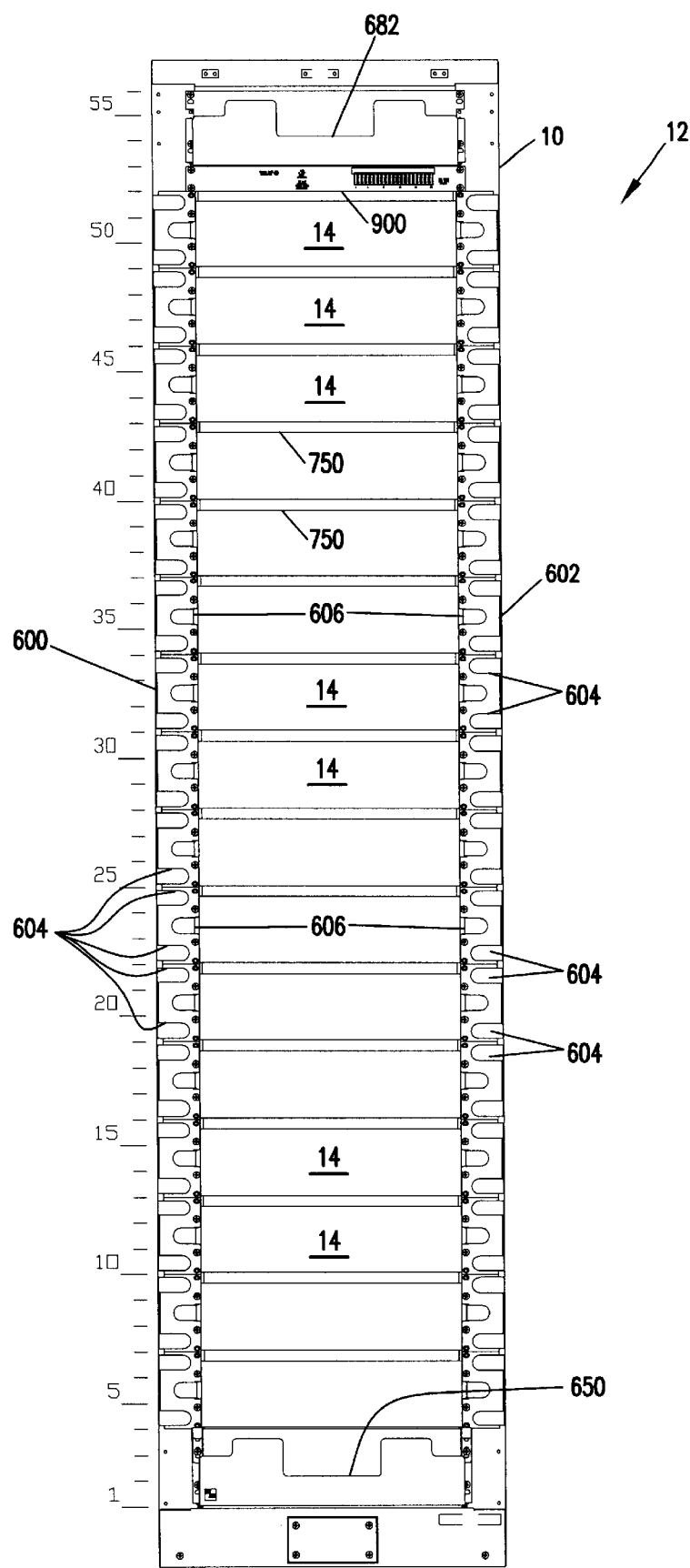
FIG. 56 is a first embodiment of a telecommunications bay including the rack of FIG. 1 and including cable management features mounted to the rack.
Figure 57:
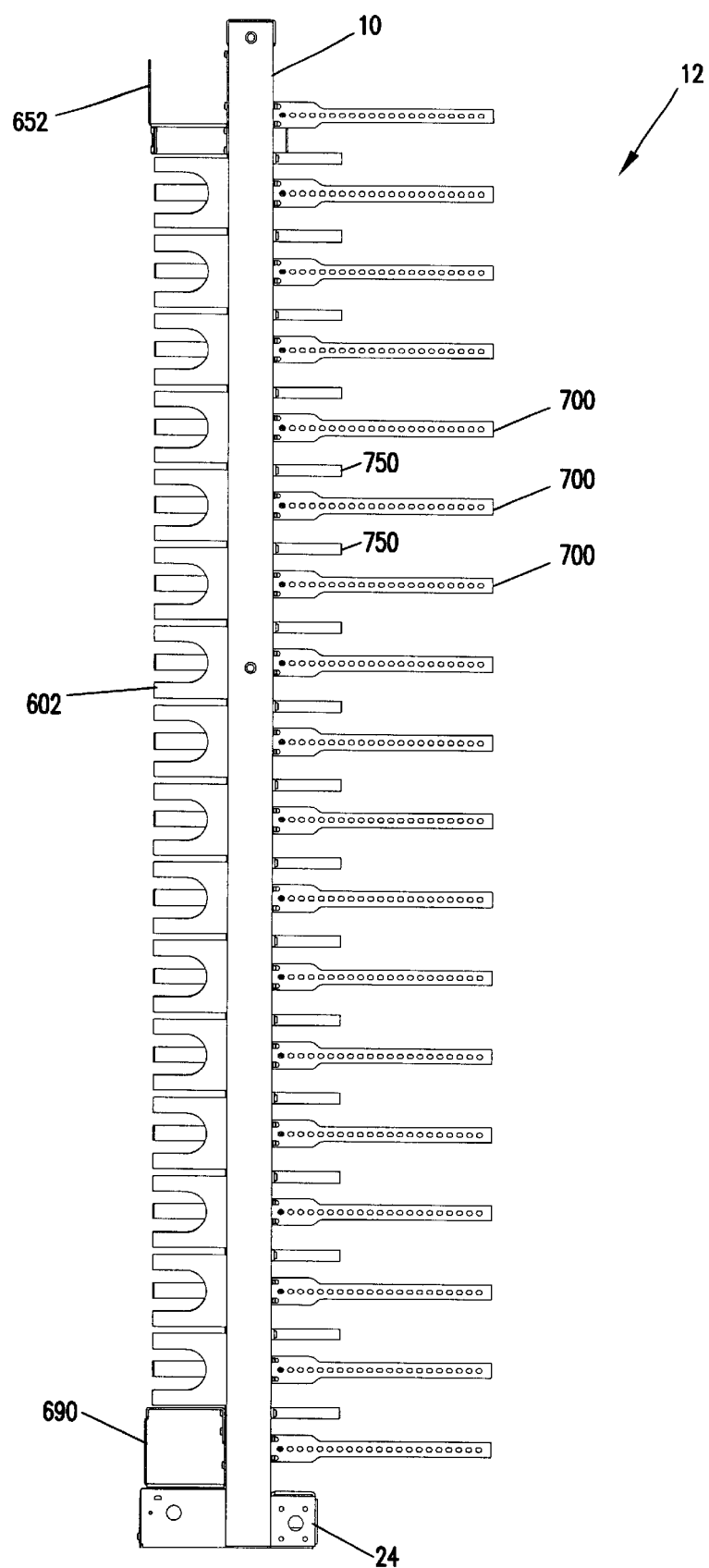
FIG. 57 is a side view of the bay of FIG. 56.

FIGS. 1–55 show various views of a preferred embodiment of a telecommunications equipment rack 10. Rack 10 may be equipped with various cable management features such as in an embodiment of a telecommunications bay 12 of FIGS. 56–63 where bay 12 is configured for use in a cross-connect situation. In bay 12, various input/output connection locations are defined in equipment spaces 14. Examples of equipment and a rack for holding the equipment arranged for cross-connecting in/out cables are shown in U.S. Pat. No. 6,102,214, previously incorporated by reference.

Referring again to FIGS. 1–55, rack 10 includes a frame 20 having two upright channels 22 extending from opposite sides of a base 24. Upright channels 22 are interconnected by a top member 26 at a top of upright channels 22. Rack 10 defines a front 28 and a back 30.

Each upright channel 22 includes first and second nested channel members 100, 102 welded together along base portions 104, 106 at slots 107. Flanges 108, 110 are also welded to one another. Flanges 108 are equal in length and face toward the flanges 108 of the opposite channel member 100. Flanges 110 diverge in opposite directions to engage flanges 108. A plurality of nuts 112 welded to base portion 106 and aligned with holes 140, 142 can be used to fasten rack 10 to adjacent racks or other telecommunications panels. Each of flanges 108 includes holes 114 for receipt of fasteners to mount the equipment, such as a chassis of cross-connect modules as in U.S. Pat. No. 6,102,214. Spaced channel support plates 116 are welded in place across channel 118 of channel member 102.

Top member 26 includes first and second nested channel members 200, 202 welded to one another and to vertical channel members 100, 102. A plurality of nuts 204 are welded to channel member 202 and aligned with holes 240, 242 for mounting to system mounting hardware.

Base 24 defines a width and a length each less than 600 millimeters in the preferred embodiment. Base 24 includes a base plate 300 extending between upright channels 22. A base support 302 extends in a cross direction on each end 304 of first base plate 300. A gusset 306 at base support 302 further connects vertical channel member 102 to second plate 302 through a support plate 116. Base support 302 includes side slots 308 for receiving flanges 108 of channel member 100. Bottom slots 310 allow receipt of fasteners to mount rack 10 to the floor. Base support 302 is welded to base plate 300 and to vertical channels 22. Base plate 300 can be made from individual components welded together: middle base plate 312, left base bracket 314, and right base bracket 316. Middle base plate 312 includes a hole 318 for passage of power cables. A raised grounding strip 320 is provided on middle base plate 312. Base support 302 includes a plate portion 303 including an upright outer wall 322 spaced from outer wall 324 of base plate 300. On an opposite side of base support 302 is an upright wall 326 with a horizontal flange 328 spaced from a bottom of base plate 300.

Base 24 further includes an enclosed chamber defined by a front base support 400, a front base cover 402, and a rear base support 404. Front base support 400 and rear base support 404 are welded to base plate 300. Front base cover 402 is held by fasteners 406 to front base support 400. Each of front base support 400, front base cover 402, and rear base support 404 include an opening 401, 403, 405 for accessing an internal power supply located within base 24. Removable A/C covers 408, 410 are provided on the front and back of base 24. Top holes 412 in back base support 404 allow for installer access to bottom slots 310. Side holes 414 in back base support 400, base 300 and base supports 302 allow the passage of power cables to adjacent racks.

As seen in the top view of rack 10, back notches 502 are defined by back corners 504 of rack 10 to permit passage of telecommunication in/out cables vertically through the floor, such as for passage to vertical cable channels defined by bay 12 as will be described below.

Referring now to FIGS. 56–63, bay 12 includes first and second front cable guides 600, 602. A plurality of spaced apart fingers 604, 606 define each of front cable guides 600, 602 for receiving cross-connect cables from the cross-connect modules positioned in spaces 14 of bay 12. The modules are mounted with fasteners through holes 114 of the front flanges 108a of each upright channel 22. Cable guides 600, 602 are also front accessible between the fingers. A lower horizontal tray 650 and an upper horizontal tray 652 allow passage of cables horizontally across the front of bay 12.

Along back 30 of bay 12, rear equipment in/out cable support brackets 700, 702 are positioned along upright channels 22. Each support bracket 700, 702 includes an extension 703 with a plurality of holes 704 arranged in a linear array extending from a support or mounting tab 706 to a distal tab 708. The in/out cables can be conveniently tied to extension 703 through holes 704. Fasteners 709 mount mounting tab 706 to holes 114 on back flange 108b of vertical channel 22. A power cord tab 710 extends from mounting tab 706 opposite to extension 703. Power cord tabs 710 allow for power cables extending to and from a top of bay 12 to be segregated from the telecommunications cables held by support brackets 700, 702 along extensions 703. Slots 712 in power cord tabs 710 can be used to tie off the power cords. Adjacent each space 14 in back 30 of bay 12, a horizontal bar 750 is provided for securing the in/out cables extending into each module.

Figure 61:
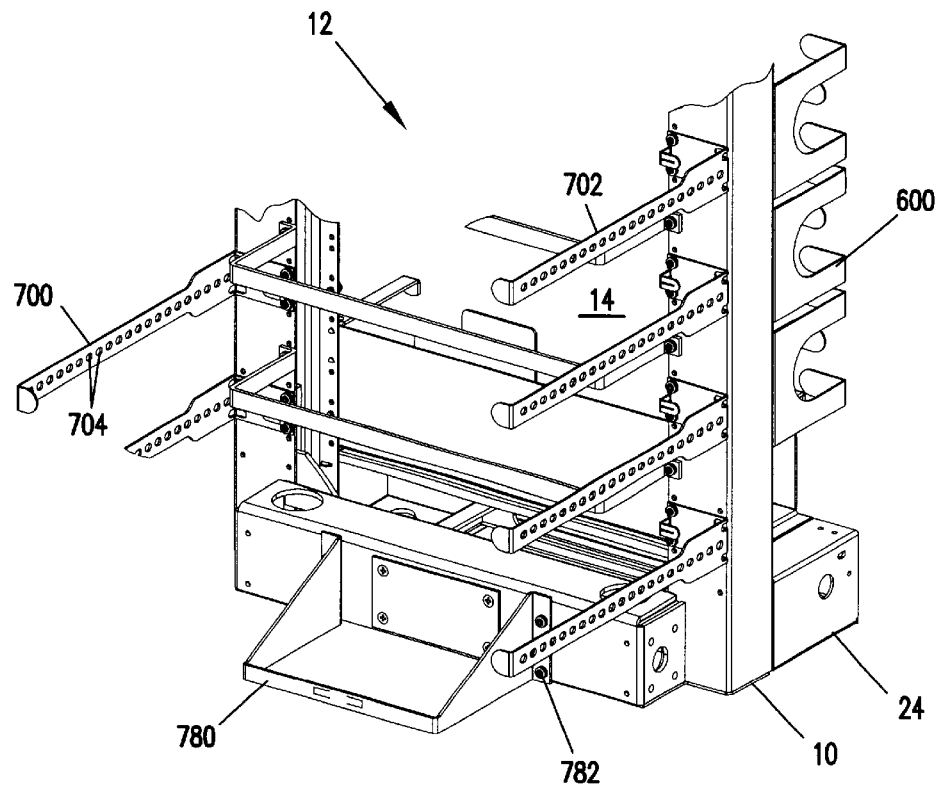
FIG. 61 is a back perspective view of the lower portion of the bay of FIG. 56.

Referring now to FIG. 61, a U-shaped floor support bracket 780 is initially mounted to bay 12 prior to mounting to a floor. Support bracket 780 provides a larger footprint than base 24 to prevent tipping of bay 12. Support bracket 780 is removed prior to final installation by removal of fasteners 782, and then discarded.

Figure 58:
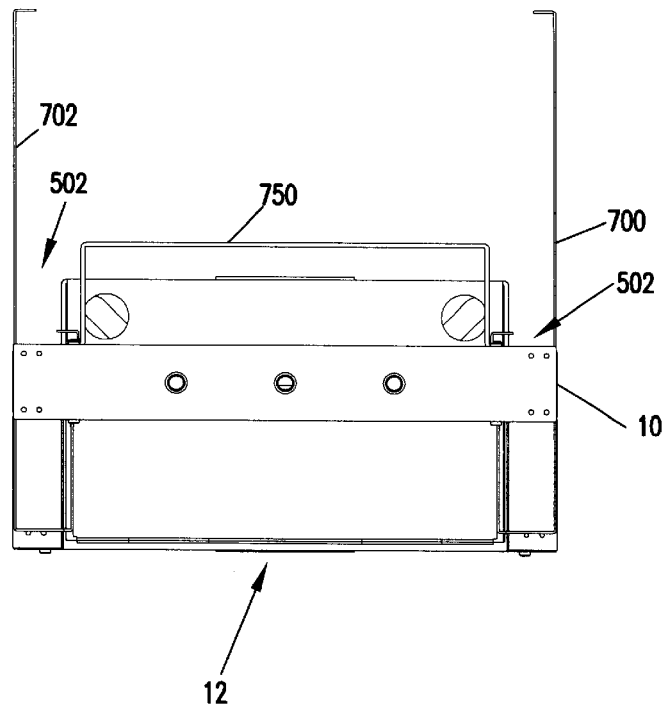
FIG. 58 is atop view of the bay of FIG. 56.
Figure 59:
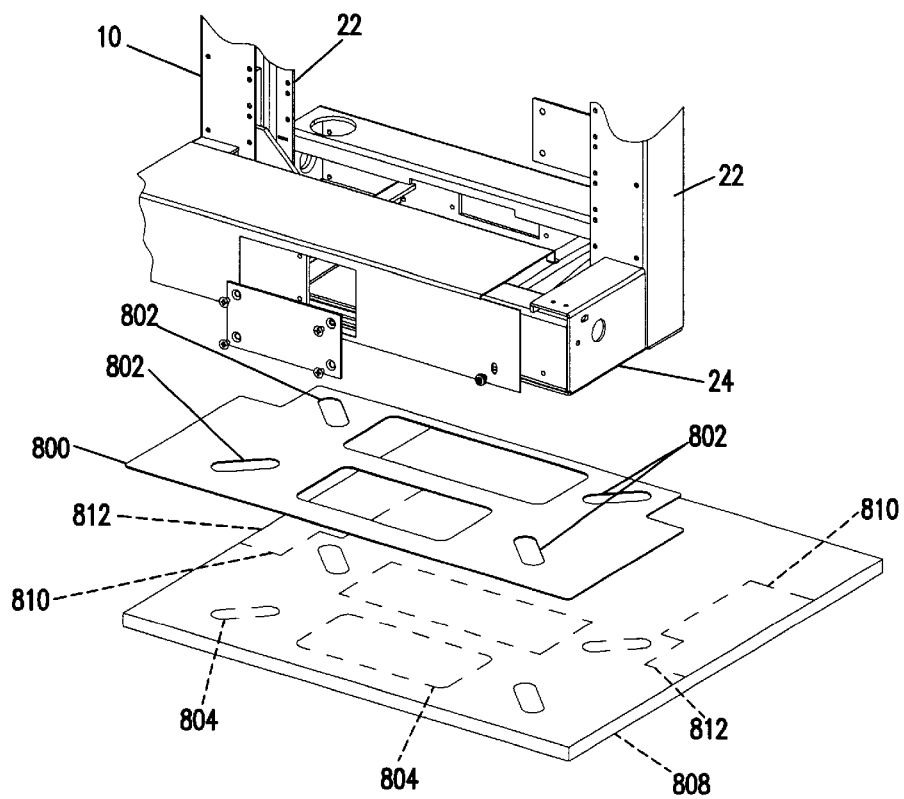
FIG. 59 is a perspective view of the lower portion of the rack of FIG. 1 shown with a template and insulation pad used to mount the rack to a floor tile.
Figure 60:
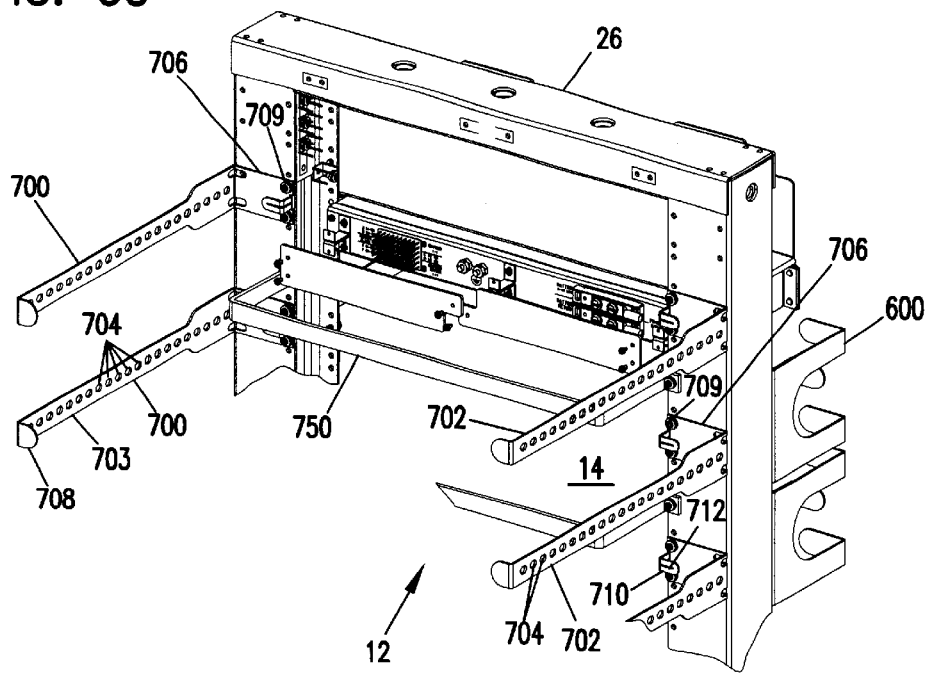
FIG. 60 is a back perspective view of the upper portion of the bay of FIG. 56.

FIG. 59 shows a rack insulating pad 800 with various openings 802 to be used a template for cutting holes in floor tile 808 during installation. After the various holes 804 are cut in the floor tile 808, pad 800 is used to insulate rack 10 from the floor. In/out cable openings 810 are cut at either side of tile 808. Notch 812 corresponds with notch 502. The footprint of bay 12 as shown in FIG. 58 fits within the perimeter of a 600×600 millimeter floor tile 808.

FIGS. 62 and 63 show a fuse and power panel 900 and wiring diagram 902 for one type of power panel which can be mounted to bay 12, such as towards the top.

Rack 10 as shown is generally 2600 millimeters tall, in one preferred embodiment. In an alternative preferred embodiment, the rack 10 can be 2200 millimeters high. Further, the various structural components of rack 10 are made from sheet steel ranging from 0.120 inches for outer and inner channel members 100, 102, outer channel members 200, base 300; 0.187 inches for inner channel member 202, base support 302, front base support 400, back base support 404; and 0.250 inches for gusset 306. In such circumstances, it is believed rack 10 is superstructured to meet Zone 4 of the Earthquake Standards.

With regard to the foregoing description, it is to be understood that changes may be made in detail, especially in matters of the shape, size and arrangement of the parts without departing from the scope of the present invention. It is intended that the specification and depicted aspects be considered exemplary only, with a true scope and spirit of the invention being indicated by the broad meaning of the following claims.

What is claimed is:

1. A rack for holding telecommunications equipment, the rack comprising:
    a frame including a front and a back;
    the frame defining a bay area formed between two spaced-apart upright vertical channels, the bay being sized for receiving the telecommunications equipment;
    each upright channel including:
       first and second nested U-shaped channel supports;
    a base mounted to the upright channels, the base defining first and second rear notches adjacent the floor, the notches positioned adjacent to the upright channels.

2. The rack of claim 1, wherein the base includes a first base plate extending between the upright channels, and two second base plates extending transversely, and a gusset between each of the second base plates and each upright channel on each side of the base.

3. The rack of claim 1, further comprising front cable guides defining vertical cable channels extending from the upright channels, the front cable guides including a plurality of spaced-apart fingers.

4. The rack of claim 1, further comprising back cable support brackets extending rearwardly from the upright channels, each back cable support bracket including an extension including a linear array of holes, a support tab extending transversely to the extension, a distal tab extending transversely to the extension at an opposite end of the extension from the support tab, and a power cord tab extending from the support tab in a direction toward the extension from an opposite side of the support tab from the extension.

5. The rack of claim 1, further comprising a removably mounted floor support bracket extending from the base.

6. The rack of claim 1, further comprising first and second nested U-shaped channel members extending between the upright channels.

7. The rack of claim 1, further comprising spaced plates mounted in the nested U-shaped channel support.

8. The rack of claim 2, wherein the second base plates include an upright wall spaced from an outer side wall of the base.

9. The rack of claim 8, wherein the second base plates each include an upright inner wall including a horizontal flange spaced from the bottom wall of the base.

10. The rack of claim 2, further comprising first and second nested U-shaped channel members extending between the upright channels.

11. The rack of claim 3, further comprising back cable support brackets extending rearwardly from the upright channels, each back cable support bracket including an extension including a linear array of holes, a support tab extending transversely to the extension, a distal tab extending transversely to the extension at an opposite end of the extension from the support tab, and a power cord tab extending from the support tab in a direction toward the extension from an opposite side of the support tab from the extension.

\* \* \* \* \*